United States Patent [19]
Lee et al.

[11] Patent Number: 6,020,236
[45] Date of Patent: Feb. 1, 2000

[54] METHOD TO FORM CAPACITANCE NODE CONTACTS WITH IMPROVED ISOLATION IN A DRAM PROCESS

[75] Inventors: Yu-Hua Lee, Hsinchu; James Wu, Kao-Hsiung; Wen-Chuan Chiang, Hsin-Chu; Min-Hsiung Chiang, Taipei, all of Taiwan

[73] Assignee: Semiconductor Manufacturing Company, Hsin-Chu, Taiwan

[21] Appl. No.: 09/257,723

[22] Filed: Feb. 25, 1999

[51] Int. Cl.⁷ .............................................. H01L 21/8242
[52] U.S. Cl. ........................................ 438/253; 438/254
[58] Field of Search ................................. 438/238–242, 438/250–256, 381, 393–399

[56] References Cited

U.S. PATENT DOCUMENTS

| | | | |
|---|---|---|---|
| 5,545,584 | 8/1996 | Wuu et al. | 437/52 |
| 5,763,306 | 6/1998 | Tsai | 438/255 |
| 5,770,498 | 6/1998 | Becker | 438/239 |
| 5,789,291 | 8/1998 | Sung | 438/254 |
| 5,981,333 | 11/1999 | Parekh et al. | 438/253 |

*Primary Examiner*—Jey Tsai
*Attorney, Agent, or Firm*—George O. Saile; Stephen B. Ackerman; Rosemary L.S. Pike

[57] ABSTRACT

A method to form capacitance node contacts with improved isolation in a DRAM process is described. An isolation layer is formed on a semiconductor substrate. A first contact hole is formed and filled with a polysilicon plug and the top surface of the isolation layer and of the polysilicon plug are polished to a planar surface. A first interpoly isolation layer is deposited. A stopping layer is deposited. A capping layer is deposited. A first polysilicon layer is deposited. The first polysilicon layer is etched to form features. A second interpoly isolation layer is deposited. The second interpoly isolation layer is planarized. The second contact hole is etched through the second interpoly isolation layer and the capping layer. The exposed first polysilicon material is etched back to the vertical sides of the second contact hole. The stopping layer and the first interpoly isolation layer are etched through to the top surface of the polysilicon plug. A lining layer of silicon nitride is deposited and etched to remain only on the vertical interior surfaces of the second contact hole. A second polysilicon layer is deposited to fill the second contact hole. The second polysilicon layer and the second interpoly isolation layer are planarized. The fabrication of the integrated circuit device is completed.

20 Claims, 3 Drawing Sheets

METHOD TO FORM CAPACITANCE NODE CONTACTS WITH IMPROVED ISOLATION IN A DRAM PROCESS

BACKGROUND OF THE INVENTION (1) Field of the Invention

The present invention relates to a method of forming semiconductor structures, and more particularly, to a method of forming capacitance node contacts in the dynamic random access memory (DRAM) fabrication process.

(2) Description of the Prior Art

DRAM memory cells are a well-known class of semiconductor devices in the art. These devices provide a means of temporary data storage, and they are used in many digital systems, such as computers.

Because of intense competition in the DRAM marketplace, it is essential that manufacturers reduce the cost of their DRAM memory circuits. To reduce costs and to meet customer expectations for decreasing access times and increasing IC memory sizes, manufacturers must continually reduce the size of features on the integrated circuit wafer. Such reductions in feature size have brought about much advancement in the art. However, the small geometries present problems in the predictable manufacture of DRAM circuits.

One manufacturing problem is illustrated in the partially completed prior art DRAM cell depicted in cross-section in FIG. 1. In this schematic, typical layers for a DRAM are shown. The cell contains a substrate 11 typically composed of lightly doped P-type monocrystalline silicon. A thin layer of gate oxide 12 overlays the substrate surface. A polysilicon layer 13 overlays the gate oxide 12 and both layers have been patterned to form the two transistor gates depicted. A gate cap 14 and sidewall spacer 16, each of silicon nitride, insulate the gate structures. The transistor source and drain regions in the substrate contain a lightly doped N-type region 15 and a heavily doped N-type region 17. Overlying the gates are silicon oxide layers 18 and 20 and 22. A polysilicon plug 19 fills the region between the two transistor gates and contacts the surface of the substrate 11. Two polysilicon bit lines 21 are shown. A silicon nitride liner layer 23 typically isolates the polysilicon capacitance node 24 from the bit lines 21.

In the example, however, the capacitance node 24 is shorted to the bit line 21 at location 25. This short effectively disables the function of the DRAM cell. The manufacturing problem that caused the short was a large misalignment between the polysilicon bit lines 21 and the contact hole for the polysilicon capacitor node 24. Because of the misalignment, the silicon nitride liner layer 23 did not cover all of the polysilicon bit line 21 after the dry etch step. This manufacturing problem occurs most often at process geometries of less than 0.25 microns, when the specifications become very tight.

Several prior art approaches attempt to reduce the likelihood or severity of shorts between the capacitor node and the bit lines. U.S. Pat. No. 5,763,306 to Tsai shows the conventional contact hole etch. In this invention, a silicon nitride layer overlays the bit line to act as a stop layer in the contact etch. U.S. Pat. No. 5,545,584 to Wuu et al teaches another conventional contact process. U.S. Pat. No. 5,770,498 to Becker shows the conventional contact node etch with no liner. U.S. Pat. No. 5,789,291 to Sung teaches the use of oxide sidewall spacers to line the contact hole used to form the DRAM capacitor.

SUMMARY OF THE INVENTION

A principal object of the present invention is to provide an effective and very manufacturable method of fabricating contacts between polysilicon lines.

A further object of the present invention is to provide an effective and very manufacturable method for fabricating capacitance contact nodes in the DRAM process with improved isolation from adjacent polysilicon bit lines.

Yet a further object of the present invention is to provide a manufacturing method that greatly reduces polysilicon plug loss in the DRAM capacitance node structure.

In accordance with the objects of this invention, a new method of fabricating capacitance node contacts between underlying polysilicon bit lines in DRAM cells has been achieved. The method reduces the possibility of shorts between the capacitance nodes and the bit lines even when there is substantial misalignment between the bit line layer and the contact mask. Further, the method improves control of the loss of the underlying polysilicon plug. While the invention and its preferred embodiments are taught as a part of a DRAM process, it should be apparent to those skilled in the art that the method could also be used to improve the isolation of any contact hole between adjacent polysilicon features.

A semiconductor substrate is provided. Sub-surface features, such as heavily doped drains and lightly doped drains, are provided in the substrate by conventional methods. On the surface of the substrate, DRAM word lines are provided. These word lines are constructed as a stack of gate silicon oxide, polysilicon gate, and capping silicon nitride. Sidewall spacers of silicon nitride are also provided on the word lines. A silicon oxide layer is provided overlying the word lines and the substrate. Self-aligned contact openings are created through the silicon oxide layer to the substrate surface and are filled with a polysilicon plug layer. The plug polysilicon layer and the oxide layer are polished down to define the capacitor plugs and to flatten the surface topology. A first interpoly isolation layer is deposited overlying the silicon oxide layer and the capacitor plugs. A stopping layer is deposited overlying the first interpoly isolation. A capping layer is deposited overlying the stopping layer. A first polysilicon layer is deposited overlying the stopping layer. Bit lines are defined in the first polysilicon layer through a photolithography and etch sequence. A second interpoly isolation layer is deposited and polished to obtain a planar surface. Photoresist is deposited overlying the second interpoly isolation layer and is patterned using a photolithography and etching sequence. Capacitor node contact holes are etched through the second interpoly isolation and capping layer to the stopping layer. Any bit line material not covered by the second interpoly isolation is etched back to the vertical surfaces of the capacitor node contact holes. The stopping layer and first interpoly isolation layer are etched through to the top surface of the polysilicon plugs. A silicon nitride layer is deposited overlying the second interpoly isolation and the interior surface of contact holes. The silicon nitride layer is etched such that it remains only on the vertical interior surfaces of the contact holes, and, as such, forms the lining of the capacitance nodes. A second polysilicon layer is deposited overlying the second interpoly isolation and completely filling the contact holes. The second polysilicon layer and the second interpoly oxide layer are polished down to define the capacitance nodes and to flatten the surface topology. This completes the formation of the capacitance node contacts in the DRAM process.

BRIEF DESCRIPTION OF THE DRAWINGS

In the accompanying drawings forming a material part of this description, there is shown.

DESCRIPTION OF THE PREFERRED EMBODIMENTS

Figure 2:
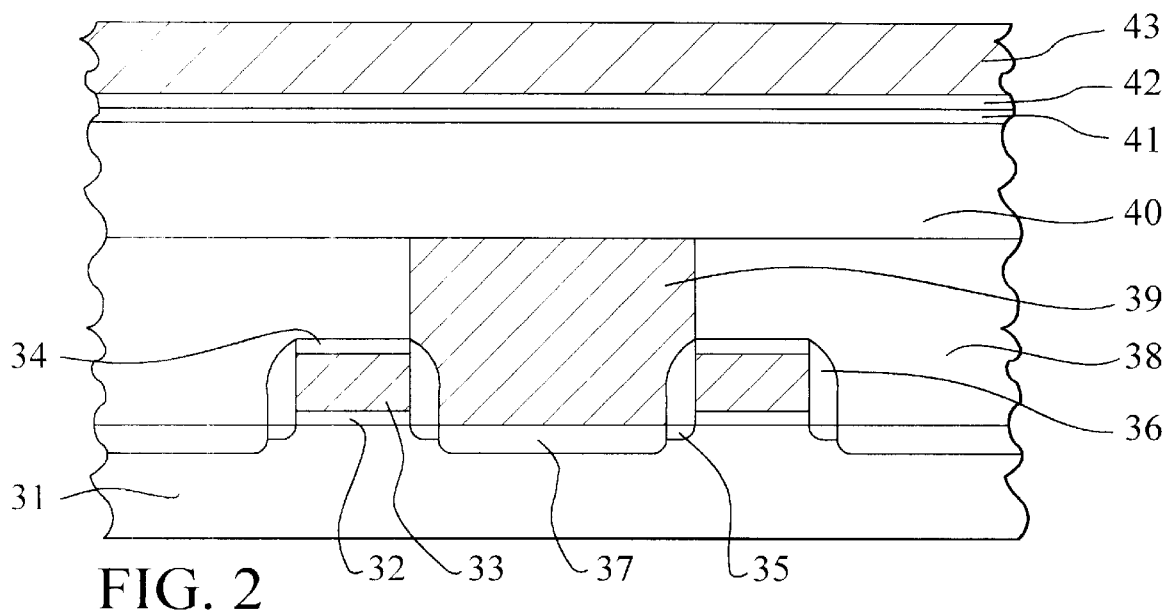
FIGS. 2 through 6 schematically illustrate in cross-sectional representation a preferred embodiment of the present invention.

Referring now more particularly to FIG. 2, there is illustrated a portion of a partially completed DRAM capacitance node structure. Semiconductor substrate 31 is preferably composed of monocrystalline silicon. Subsurface drain regions composed of lightly doped regions 35 and heavily doped regions 37 are formed by methods common to the art. MOS transistors, that will be used as DRAM word lines, overlie the substrate 31 and are composed of a patterned stack made of a capping silicon nitride layer 34 overlying a polysilicon gate layer 33 overlying a silicon gate oxide layer 32, though other materials and methods common to the art could be used. Sidewall spacers 36 are preferably composed of silicon nitride and are formed by conventional methods.

A layer of silicon oxide is deposited overlying the substrate 31 and the MOS transistors. Self-aligned contact openings are defined by conventional photolithography and are then etched through the silicon oxide layer 38 to the substrate surface. A layer called the plug polysilicon 39 is deposited overlying the silicon oxide layer and the inner surface of the self-aligned contact holes. The plug polysilicon layer 39 and the silicon oxide layer 38 are polished down, preferably through the use of a chemical mechanical polish, to define the capacitor plugs and to flatten the surface topology.

A first interpoly isolation layer 40, preferably composed of silicon oxide, is deposited overlying the surface of the silicon oxide layer 38 and the polysilicon plugs 39 to a thickness of between about 500 and 5000 Angstroms.

Next an etch stopping layer 41, preferably composed of either silicon nitride or silicon oxynitride (SiON), is deposited overlying the first interpoly isolation. This stopping layer 41 is a key feature of the invention because this layer that acts as a stop in the subsequent contact etch step. In the preferred embodiment, the stopping layer 41 is composed of silicon nitride deposited to a thickness of between about 100 and 500 Angstroms. Alternatively, the stopping layer 41 could be composed of silicon oxynitride (SiON) to a thickness of between about 100 and 500 Angstroms.

A capping layer 42, preferably composed of silicon oxide, is deposited overlying the stopping layer 41 to a thickness of between about 100 and 200 Angstroms. This capping layer 42 acts as a stress relief layer and as an etching stop layer for the polysilicon etch. Next, a first polysilicon layer 43 is deposited overlying the capping layer 42 by conventional means.

Figure 3:
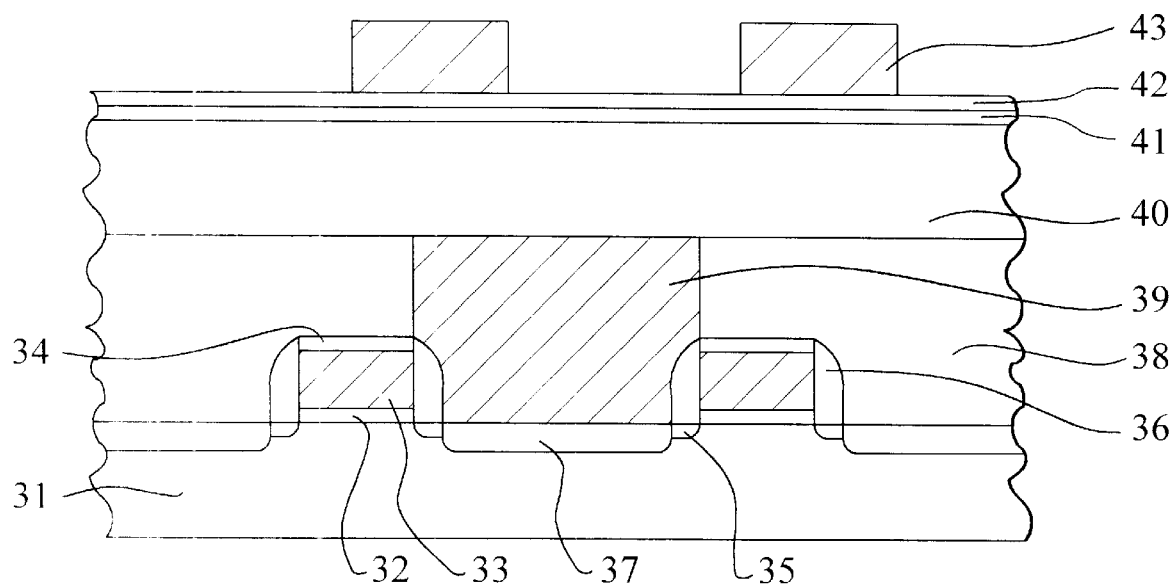

Referring now to FIG. 3, the DRAM bit lines are defined in the first polysilicon layer 43 using a photolithography and etch sequence conventional to the art. Notice that the bit lines 43 are misaligned with respect to the polysilicon plug 39 in the underlying cross section. Such a misalignment means that a subsequent capacitance contact hole ideally aligned to the polysilicon plug 39 would create the same shorting problem experienced in the prior art example. This misalignment should not be considered part of the preferred embodiment, rather, it is intended to show how the invention can withstand even a large misalignment in the manufacturing process without creating a defect.

Figure 4:
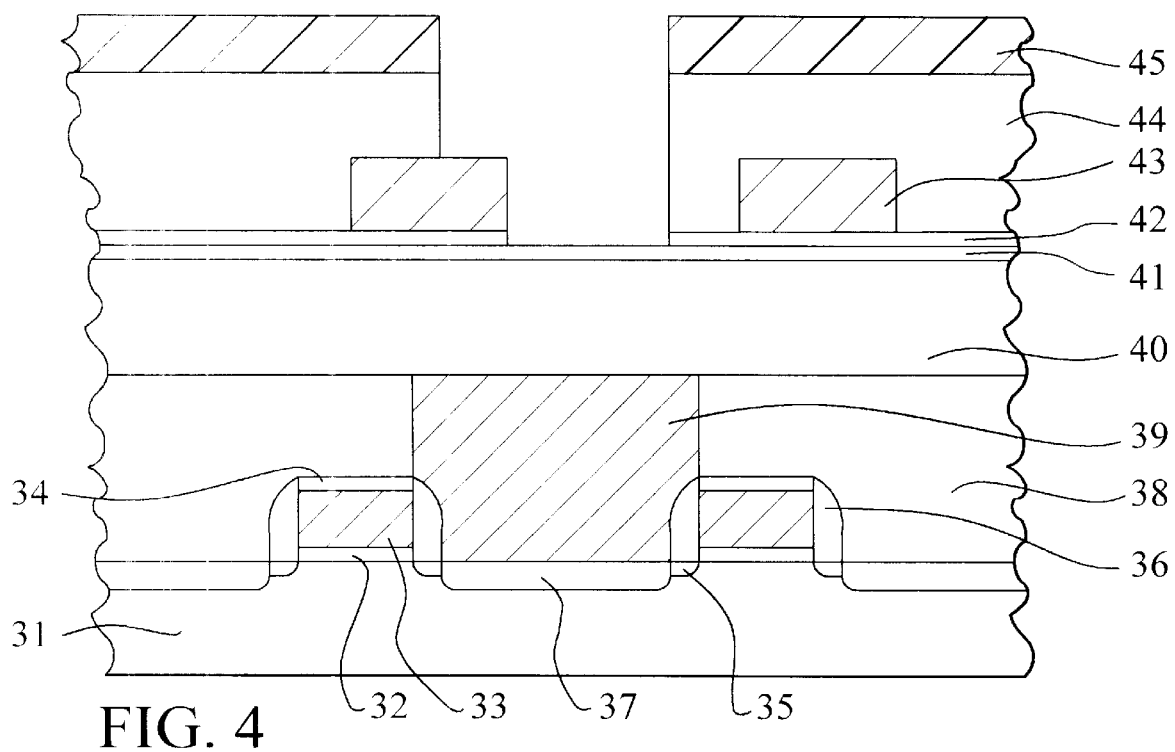

Referring to FIG. 4, a second interpoly isolation 44, preferably composed of silicon oxide, is deposited overlying the bit lines 43 and the capping layer to a thickness of about 7000 Angstroms.

A layer of photoresist 45 is spun on overlying the second interpoly layer 44. A sequence of conventional photolithography and etching is used to define holes in the photoresist 45.

The first contact etch process is a key feature of the invention because it is a selective etch process that etches the second interpoly isolation layer 44 and the capping layer 42 but stops etching when it hits the stopping layer 41. After the first contact etch, FIG. 4 shows that one of the polysilicon bit lines 43 is no longer covered by the second interpoly isolation layer 44 because of the misalignment. A conventional reactive ion etching (RIE) process, using a chemistry of $CH_4$, $CHF_3$, and Ar, creates this contact hole in the capacitor over bitline (COB) structure.

Figure 5:
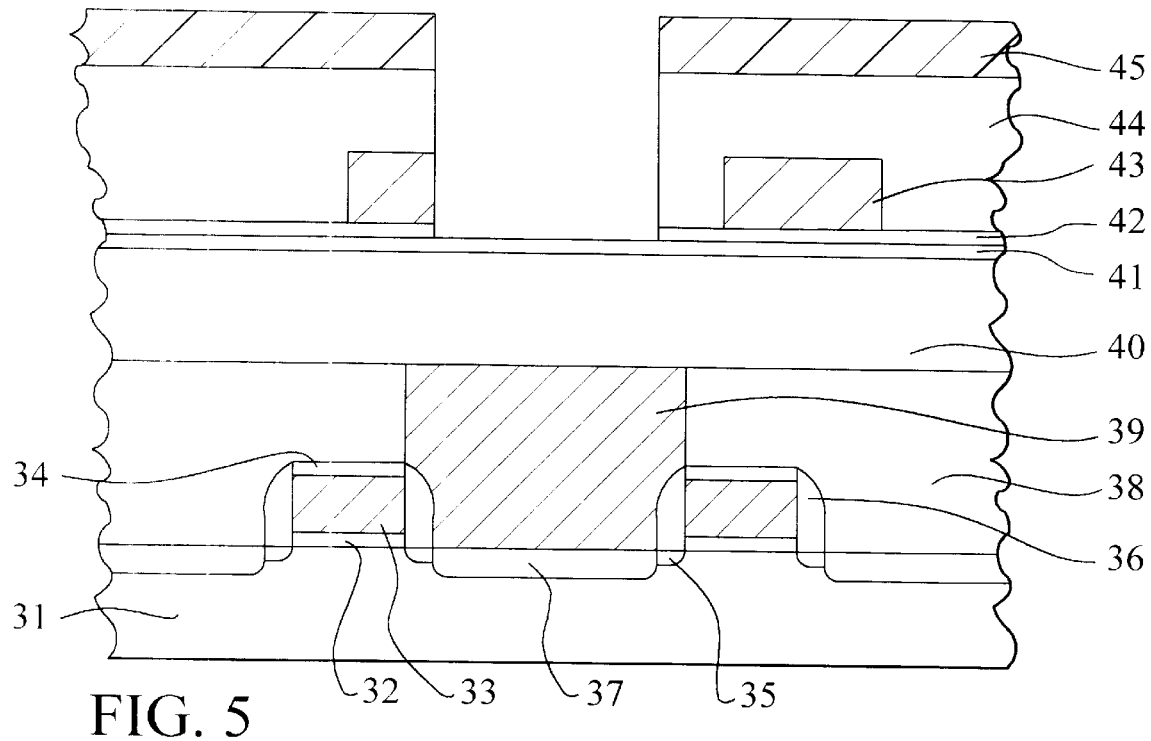

Referring to FIG. 5, another key feature of the invention is described. A polysilicon etch is performed. Any part of the polysilicon bit lines 43 that are not covered by the second interpoly isolation layer will be removed. The capping layer 42 underlying the etched polysilicon bit lines 43 will also be removed. This etch is completed using a conventional RIE process with a chemistry of $Cl_2$ and HBr.

An etch is performed to break through the stopping layer 41. This etch also etches the silicon oxide layer 40 down to the top surface of the polysilicon plug 39. This etch is performed by switching from the polysilicon etching recipe to a conventional oxide etching recipe of $CH_4$, $CHF_3$, and Ar. The photo resist layer 45 is then removed using conventional techniques.

Figure 6:
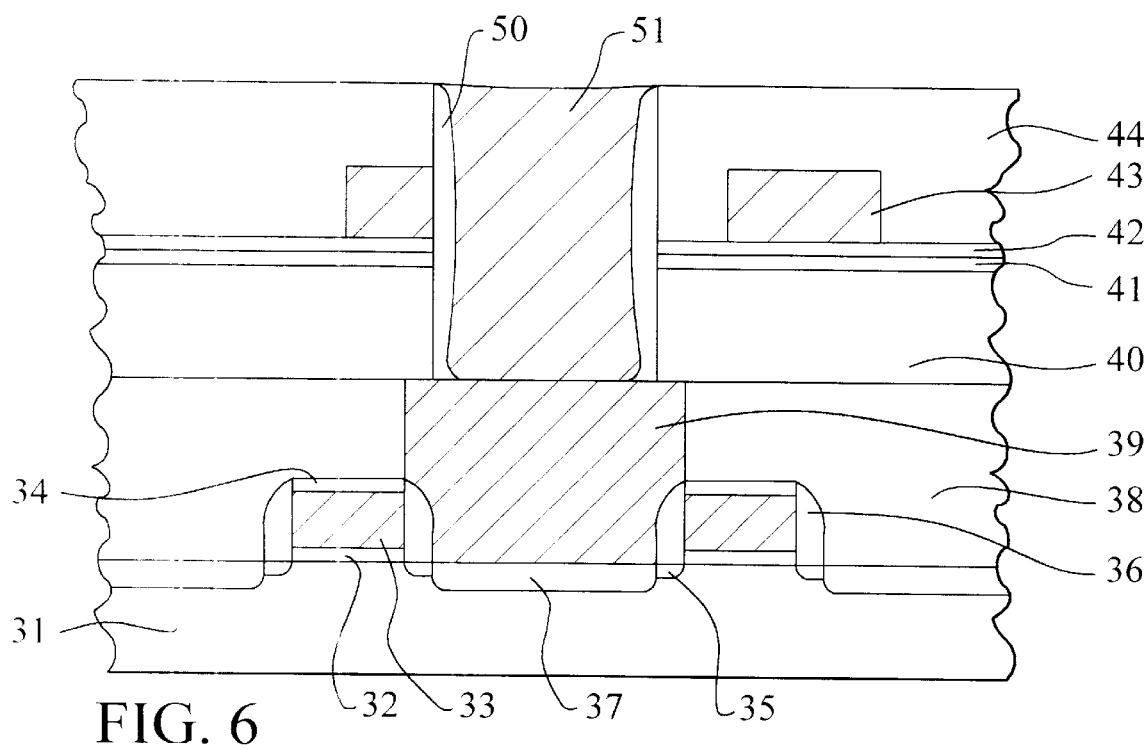

Referring now to FIG. 6, a lining layer 50, preferably of silicon nitride is deposited overlying the second isolation layer 44 and the interior surface of the contact holes to a thickness of between about 100 and 300 Angstroms. The lining layer 50 is then dry etched such that it remains only on the vertical interior surface of the contact holes, and, as such, forms the lining of the capacitance node contact holes.

A second polysilicon layer 51 is deposited overlying the second interpoly isolation 44 and completely filling the contact holes. The second polysilicon layer 51 and the second interpoly oxide layer are polished down, preferably using a chemical mechanical polish, or CMP. The CMP step defines the capacitance nodes and flattens the surface topology. This completes the formation of the capacitance node contacts in the DRAM process.

Figure 1:
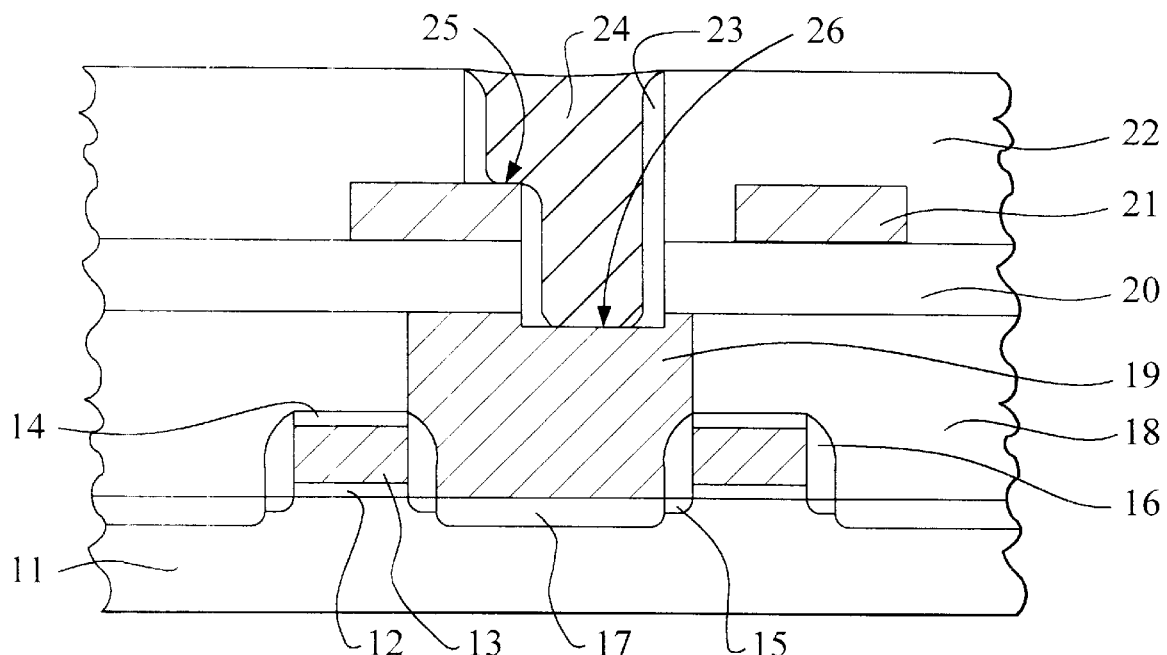
FIG. 1 schematically illustrates in cross-section a partially completed prior art DRAM capacitance node structure showing a short formed between a bit line and the capacitance node.

It can now be demonstrated how the process features positively impact the performance and manufacturability of the capacitance node contacts. First, compare the cross-section of the partially completed structure of the preferred embodiment depicted in FIG. 6 with that of the prior art structure shown in FIG. 1. Due to the misalignment, a section of the polysilicon bit line has become exposed in both methods. However, the invention's key features, using an etch stopping layer and removing the exposed section of the polysilicon bit line, have corrected the defect. This method allows the silicon nitride lining layer to properly cover and isolate the remaining section of the bit line from the capacitance node polysilicon.

Second, the invention's key feature of using an etch stopping layer also means that less of the underlying polysilicon plug is lost due to over etching.

The process of the present invention provides a very manufacturable process for forming capacitance node contacts with improved isolation in a DRAM process.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an integrated circuit device comprising:

providing semiconductor device structures in and on a semiconductor substrate wherein said semiconductor device structures include an isolation layer on said semiconductor substrate, wherein a first contact hole is formed and filled with a polysilicon plug contacting said semiconductor substrate, and wherein the top surface of said isolation layer and of said polysilicon plug are polished to a first planar surface;

depositing a first interpoly isolation layer overlying said first planar surface;

depositing a stopping layer overlying said first interpoly isolation layer;

depositing a capping layer overlying said stopping layer;

depositing a first polysilicon layer overlying said capping layer;

etching said first polysilicon layer in areas defined by photolithographic process to form features in said first polysilicon layer;

depositing a second interpoly isolation layer overlying said first polysilicon layer and said first interpoly isolation layer;

polishing down said second interpoly isolation layer to obtain a second planar surface;

depositing a photoresist layer overlying said second interpoly isolation layer;

etching said photoresist layer to define a second contact hole in area overlying said semiconductor structures as defined by photolithographic process;

etching through said second interpoly isolation layer and said capping layer to form said second contact hole wherein said etching stops at said stopping layer;

etching back said first polysilicon material where not covered by said second interpoly isolation layer to the vertical sides of said second contact hole;

etching through said stopping layer and said first interpoly isolation layer to complete said second contact hole and to expose said top surface of said polysilicon plug;

depositing a silicon nitride lining layer overlying said second interpoly isolation layer and the interior surface of said second contact hole;

etching said lining layer whereby said lining layer remains only on said vertical interior surfaces of said second contact hole;

depositing a second polysilicon layer overlying said second interpoly isolation layer and completely filling said second contact hole;

polishing down said second polysilicon layer and said second interpoly isolation layer to flatten and define the top surface; and completing said fabrication of said integrated circuit device.

2. The method according to claim 1 wherein said stopping layer is silicon nitride formed to a thickness of between about 100 and 500 Angstroms.

3. The method according to claim 1 wherein said stopping layer is silicon oxynitride formed to a thickness of between about 100 and 500 Angstroms.

4. The method according to claim 1 wherein said capping layer is silicon oxide formed to a thickness of between about 100 and 200 Angstroms.

5. The method according to claim 1 wherein said first interpoly isolation layer is silicon oxide formed to a thickness of between about 3000 and 7000 Angstroms.

6. The method according to claim 1 wherein said second interpoly isolation layer is silicon oxide formed to a thickness of between about 3000 and 7000 Angstroms.

7. The method according to claim 1 wherein the presence of said lining layer prevents a short between said second polysilicon layer and said first polysilicon layer.

8. A method of fabrication of a DRAM capacitance contact node in an integrated circuit comprising:

providing semiconductor device structures in and on a semiconductor substrate wherein said semiconductor device structures include MOS transistor gates having silicon nitride sidewalls and wherein a self-aligned contact is formed and filled with a polysilicon plug contacting said semiconductor substrate between two of said MOS transistor gates;

depositing a first interpoly isolation layer overlying said semiconductor device structures;

depositing a stopping layer overlying said first interpoly isolation layer;

depositing a capping layer overlying said stopping layer;

depositing a first polysilicon layer overlying the capping layer;

etching said first polysilicon layer in areas defined by photolithographic process to form bit lines;

depositing a second interpoly isolation layer overlying said bit lines and said first interpoly isolation layer;

polishing down said second interpoly isolation layer to obtain a planar surface;

depositing a photoresist layer overlying said second interpoly isolation layer;

etching said photoresist layer to define a capacitance contact hole in area overlying said semiconductor structures as defined by photolithographic process;

etching through said second interpoly isolation layer and said capping layer and thereby forming said capacitance contact hole wherein said etching stops at said stopping layer and whereby a portion of one of said bit lines is exposed within said capacitance contact hole;

etching back said exposed portion of said bit lines where not covered by said second interpoly isolation layer to the vertical sides of said capacitance contact hole;

etching through said stopping layer and said first interpoly isolation layer to complete said capacitance contact hole and to expose the top surface of said polysilicon plug;

depositing a silicon nitride lining layer overlying said second interpoly isolation layer and the interior surface of said capacitance contact hole;

etching said lining layer such that said lining layer remains only on said vertical interior surface of said capacitance contact hole;

depositing a second polysilicon layer overlying said second interpoly isolation layer and completely filling said capacitance contact hole;

polishing down said second polysilicon layer and said second interpoly isolation layer to define said capacitance contact node and to flatten the top surface topology; and completing said fabrication of said integrated circuit device.

9. The method according to claim 8 wherein said stopping layer is silicon nitride formed to a thickness of between about 100 and 300 Angstroms.

10. The method according to claim 8 wherein said stopping layer is silicon oxynitride formed to a thickness of between about 100 and 500 Angstroms.

11. The method according to claim 8 wherein said capping layer is silicon oxide formed to a thickness of between about 100 and 200 Angstroms.

12. The method according to claim 8 wherein said first interpoly isolation layer is silicon oxide formed to a thickness of between about 3000 and 7000 Angstroms.

13. The method according to claim 8 wherein said second interpoly isolation layer is silicon oxide formed to a thickness of between about 3000 and 7000 Angstroms.

14. The method according to claim 8 wherein the presence of said lining layer prevents a short between said second polysilicon layer and said bit lines.

15. A method of fabrication of a DRAM capacitance contact node in an integrated circuit comprising:

providing semiconductor device structures in and on a semiconductor substrate wherein said semiconductor device structures include MOS transistor gates having silicon nitride sidewalls and wherein a self-aligned contact is formed and filled with a polysilicon plug contacting said semiconductor substrate between two of said MOS transistor gates;

depositing a first interpoly isolation layer of silicon oxide overlying said semiconductor device structures;

depositing a silicon nitride stopping layer overlying said first interpoly isolation layer;

depositing a silicon oxide capping layer overlying said stopping layer;

depositing a first polysilicon layer overlying the capping layer;

etching said first polysilicon layer in areas defined by photolithographic process to form bit lines;

depositing a second interpoly isolation layer of silicon oxide overlying said first polysilicon layer and said first interpoly isolation layer;

polishing down said second interpoly isolation layer to obtain a planar surface;

depositing a photoresist layer overlying said second interpoly isolation layer;

etching said photoresist layer to define a capacitance contact hole in area overlying said semiconductor structures as defined by photolithographic process;

etching through said second interpoly isolation layer and said capping layer and thereby forming said capacitance contact hole wherein said etching stops at said stopping layer and whereby a portion of one of said bit lines is exposed within said capacitance contact hole;

etching back said bit lines where not covered by said second interpoly isolation layer to the vertical sides of said capacitance contact hole;

etching through said stopping layer and said first interpoly isolation layer to complete said capacitance contact hole and to expose the top surface of said polysilicon plug;

depositing a silicon nitride lining layer overlying said second interpoly isolation layer and the interior surface of said capacitance contact hole;

etching said lining layer such said lining layer remains only on said vertical interior surface of said capacitance contact hole;

depositing a second polysilicon layer overlying said second interpoly isolation layer and completely filling said capacitance contact hole;

polishing down said second polysilicon layer and said second interpoly isolation layer to define said capacitance contact node and to flatten the top surface topology; and completing said fabrication of said integrated circuit device.

16. The method according to claim 15 wherein said silicon nitride stopping layer is formed to a thickness of between about 100 and 300 Angstroms.

17. The method according to claim 15 wherein said silicon oxide capping layer is formed to a thickness of between about 100 and 200 Angstroms.

18. The method according to claim 15 wherein said first interpoly isolation layer is silicon oxide formed to a thickness of between about 3000 and 7000 Angstroms.

19. The method according to claim 15 wherein said second interpoly isolation layer is silicon oxide formed to a thickness of between about 3000 and 7000 Angstroms.

20. The method according to claim 15 wherein the presence of said lining layer prevents a short between said second polysilicon layer and said bit lines.

* * * * *

UNITED STATES PATENT AND TRADEMARK OFFICE
CERTIFICATE OF CORRECTION

PATENT NO. : 6,020,236
DATED : February 1, 2000
INVENTOR(S) : Yu-Hua Lee, James Wu, Wen-Chuan Chiang, Jin-Hsiung Chiang It is certified that error appears in the above-identified patent and that said Letters Patent is hereby corrected as shown below:

On the Title page, in item (73), the Assignee should read:
-- Taiwan Semiconductor Manufacturing Company, Hsin-Chu, Taiwan ---

Signed and Sealed this

First Day of May, 2001

Attest:

NICHOLAS P. GODICI

Attesting Officer

Acting Director of the United States Patent and Trademark Office